United States Patent [19]
Chen et al.

[11] Patent Number: 5,817,438
[45] Date of Patent: Oct. 6, 1998

[54] MASKING TECHNOLOGY FOR ETCHING CONTACTS

[75] Inventors: Chun-Cho Chen; Benjamin Seu-Min Lin, both of Taipei, Taiwan

[73] Assignee: Winbond Electronics Corp., Hsinchu, Taiwan

[21] Appl. No.: 736,416

[22] Filed: Oct. 24, 1996

[30] Foreign Application Priority Data

Sep. 26, 1996 [TW] Taiwan ................................. 85111789

[51] Int. Cl.$^6$ ............................................................. G03F 9/00

[52] U.S. Cl. ........................................................................ 430/5

[58] Field of Search ......................................... 430/5, 430/311, 312, 313, 314, 322

[56] References Cited

U.S. PATENT DOCUMENTS

| | | | |
|---|---|---|---|
| 5,334,467 | 8/1994 | Cronin et al. | 430/5 |
| 5,429,897 | 7/1995 | Yoshioka et al. | 430/5 |
| 5,547,787 | 8/1996 | Ito et al. | 430/5 |
| 5,620,815 | 4/1997 | Ito et al. | 430/5 |

*Primary Examiner*—S. Rosasco
*Attorney, Agent, or Firm*—Ladas & Parry

[57] ABSTRACT

A mask structure for etching contacts and its method of use. The mask structure includes: a support glass; a layer of chromium, which blocks the light completely; a layer of partial light shielding material, which determines how much light is to be transmitted by its thickness; a first contact pattern; and a second contact pattern. The first contact pattern allows full light transmission while the second contact pattern allows partial light transmission.

10 Claims, 5 Drawing Sheets

MASKING TECHNOLOGY FOR ETCHING CONTACTS

BACKGROUND OF THE INVENTION

1. Field of the Invention

The invention relates to a masking technology for etching contacts, and more particularly relates to utilizing a mask allowing full light and partial light transmission for patterning and etching contacts of different depth.

2. Description of Related Art

Generally speaking, the process for fabricating a semiconductor device is based on a semiconductor substrate, wherein the device is formed by depositing different layers on the substrate and etching them alternatively. Thus, the profile of the device, in cross section, is ragged, inevitably resulting in the formation of contacts of different depth for other proceeding processes. Etching contacts of different depth is common in semiconductor device processes, and usually accomplished by fine-tuning selectivity. In deep sub-micrometer devices, when contact size is scaled down and a self-aligned silicide (salicide) process is implemented to form self-aligned contacts, the etching process window becomes quite narrow, resulting in either critical dimension bias or substrate damage during the contact etching process. A titanium salicide contact etching process is used as an example for illustration hereinafter.

FIG. 1A through 1C, illustrate, in cross section, a contact etching process on a wafer 1. Referring to FIG. 1A, after titanium salicide layer formation, a wafer 1 is globally planed by CMP, wherein numeral 2 indicates a semiconductor substrate, numeral 3 indicates field oxide, numeral 4 indicates the spacer, numeral 5 indicates a polysilicon line for example, numeral 6 indicates titanium silicide $TiSi_2$ layers, and numeral 7 indicates inter-layer dielectric (ILD) after CMP. In FIG. 1B, the wafer 1 is coated with photoresist 8, and a conventional mask 9, which allows full light transmission 10 through its contact pattern, and is used to define the etching windows on photoresist 8. In FIG. 1C, the etching windows are defined after the development of photoresist 8, wherein there in no residual photoresist layer within the etching windows 11, and the difference between the thickness of the ILD above the on-field-oxide $TiSi_2$ layer and that above the $TiSi_2$ layer formed on the substrate 2 is represented by $\Delta x$. Anisotropical etching is used to etch the contacts. During the etching process, when the etching gases start to attack the on-field-oxide $TiSi_2$ layer in the shallow contact 12, ILD with a thickness of $\Delta x$ remains for etching in the deep contact 13. Consequently, when the etching of deep contact 12 reaches its etching stop ($TiSi_2$), the on-field-oxide $TiSi_2$ and polysilicon line 4 are damaged by the etching gases, as shown in Fig. 1D, such that the damage of $TiSi_2$ and polysilicon line 4 causes unacceptable high contact resistance and degrades the performance of the semiconductor device. The situation is even worse since the silicide on top of doped polysilicon is usually thinner and more unstable than the silicide formed on active regions, and the contact etching traditionally has poor oxide selectivity with respect to $TiSi_2$.

SUMMARY OF THE INVENTION

Accordingly, an object of the present invention is to provide a masking technology for etching contacts of different depth and moderating the excess of contact loss due to ILD thickness difference after CMP.

Another object of the present invention is to propose a mask structure which allows full light and partial light transmission through its contact pattern.

A mask structure according to the present invention consists of: a support glass; a layer of chromium, which blocks the light completely; a layer of partial light shielding material, which determines how much light is to be transmitted by its thickness; a first contact pattern; and a second contact pattern; wherein the layout of the layer of chromium and partial light shielding material over the support glass determines the first contact pattern, which allows full light transmission, and the second contact pattern, which merely allows partial light transmission.

Further, a method for etching a plurality of contacts in a semiconductor wafer, by using the mask according to the invention, includes the steps of: forming a layer of photoresist on the wafer; forming a plurality of windows on the layer of photoresist, wherein after development there is residual photoresist within portions of the windows; and forming the contacts in the semiconductor wafer through the windows. The residual photoresist described above acts as a sacrificial layer, which moderates contact loss due to differences of ILD thickness and prevents the raising contact resistance during the etching process.

DETAILED DESCRIPTION OF THE INVENTION

Figure 1A:
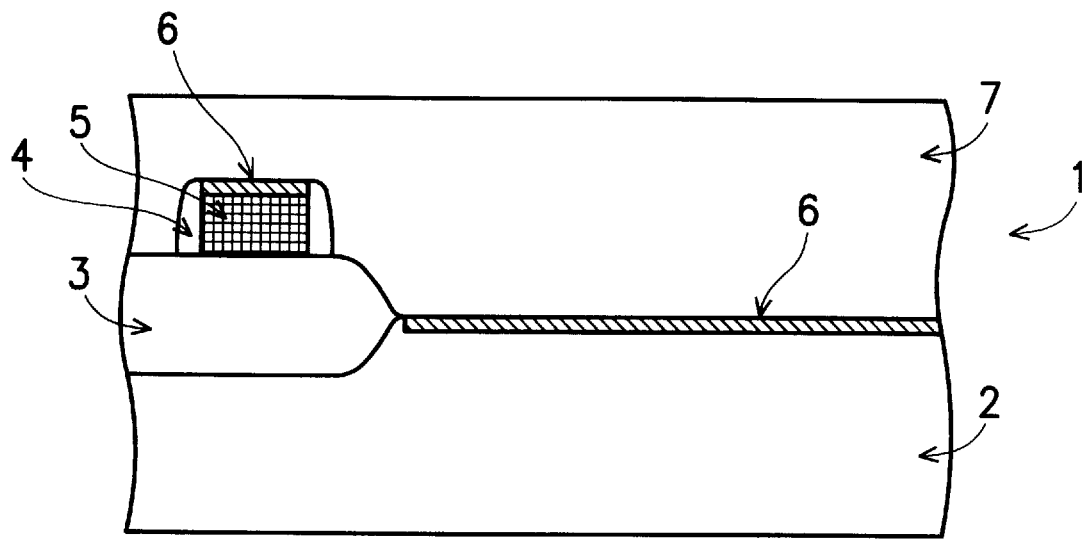
FIGS. 1A through 1D illustrate, in cross section, the process for etching contacts according the prior art.
Figure 1B:
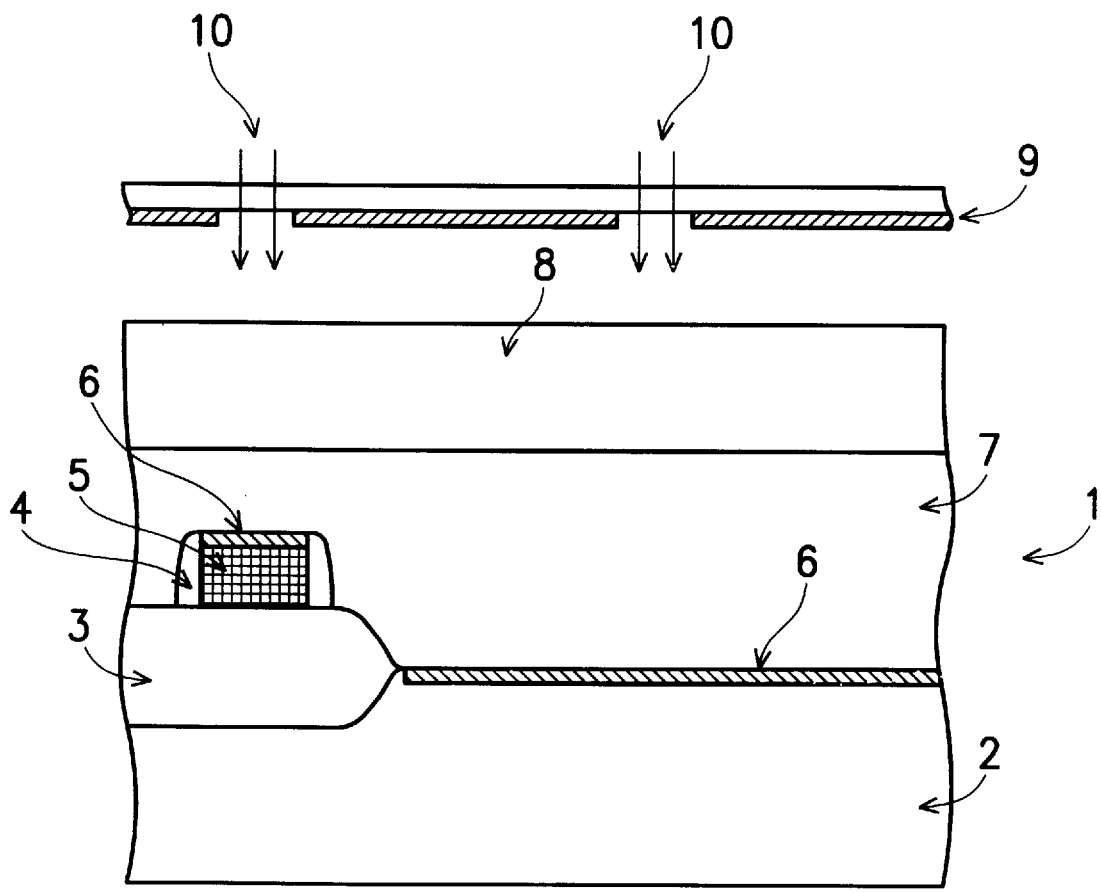
Figure 1C:
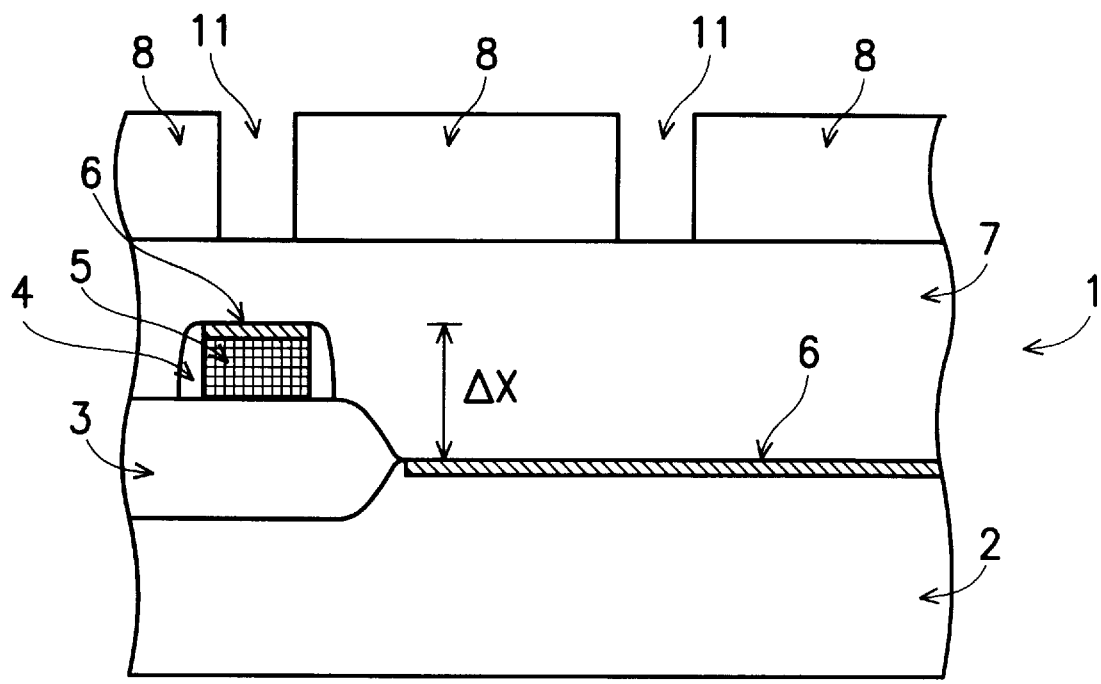
Figure 1D:
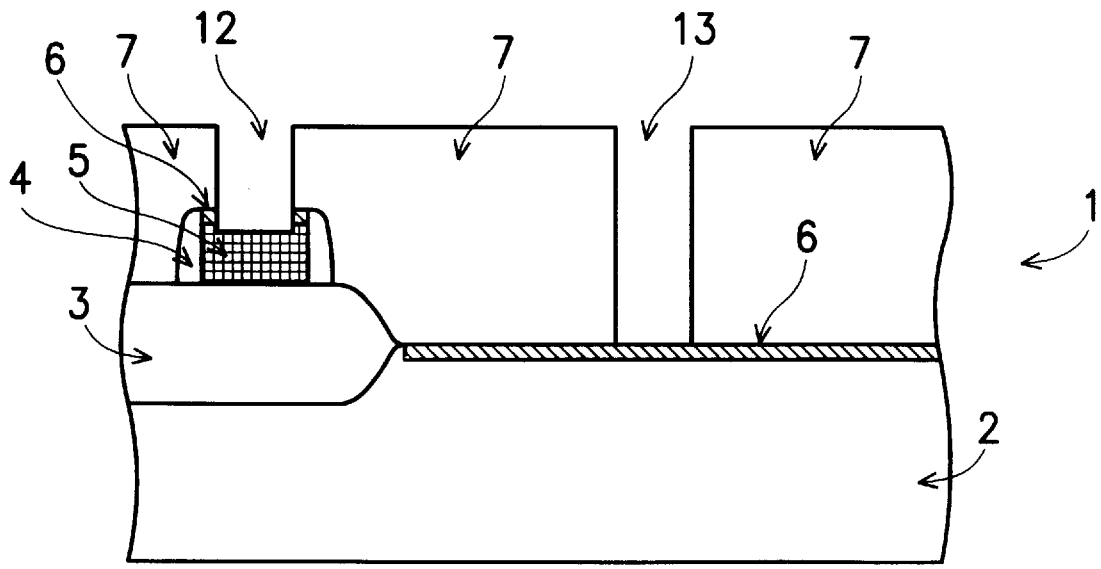

The present invention to utilize a mask allowing full light and partial light transmission for patterning and etching contacts of different depth is described hereinafter. Wherever possible, the same reference numerals will be used throughout the drawings to refer to the same or corresponding matter.

Figure 2:
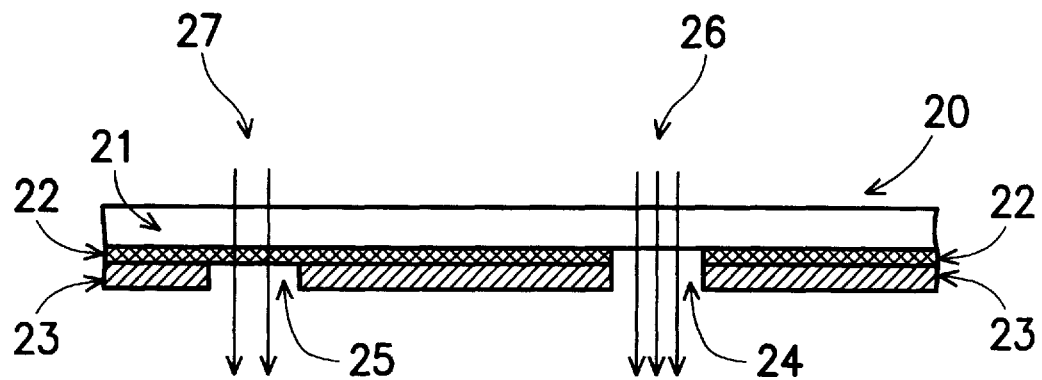
FIG. 2 illustrates, in cross section, an embodiment of a mask structure according to the invention.

FIG. 2 illustrates an embodiment of a mask structure according to the invention. Referring to FIG. 2, a mask structure 20 comprises:

a support glass 21;

a layer of partial light shielding material 22, formed over the support glass 21;

a layer of chromium 23, formed over the layer of partial light shielding material 22;

a first contact pattern region 24, which is formed by removing portions of the layer of chromium 23 and the layer of partial light shielding material 22 over the support glass 20 simultaneously; and a second contact pattern region 25, which is formed by simply removing portions of the layer of chromium 23 over the layer of partial light shielding material 22; wherein the first contact pattern region 24 allows full light 26 transmission and the second contact pattern region 25 merely allows partial light 27 transmission.

Figure 3:
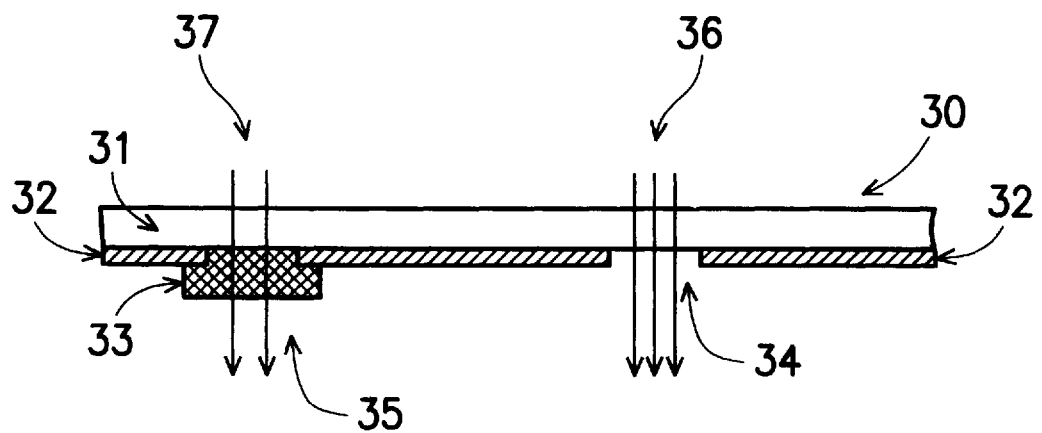
FIG. 3 illustrates, in cross section, another embodiment of a mask structure according to the invention.

FIG. 3 illustrates an another embodiment of a mask structure according to the invention. Referring to FIG. 3, a mask structure 30 comprises:

a support glass 31;

a layer of chromium 32, formed over the support glass 31;

a first contact pattern region 34, which is formed by removing a portion of the layer of chromium 32 over said support glass 31; and a second contact pattern region 35, which is formed by depositing layers of partial light shielding material 33 over a portion of the first contact pattern regions 34 to form the second contact pattern regions 35; wherein the first contact pattern region 34 allows full light 36 transmission and the second contact pattern region 35 merely allows partial light 37 transmission.

The layer of partial light shielding material described above is a compound which consists of molybdenum and oxygen ($MoO_x$) or silicon, nitrogen and oxygen ($SiN_xO_y$).

Figure 4A:
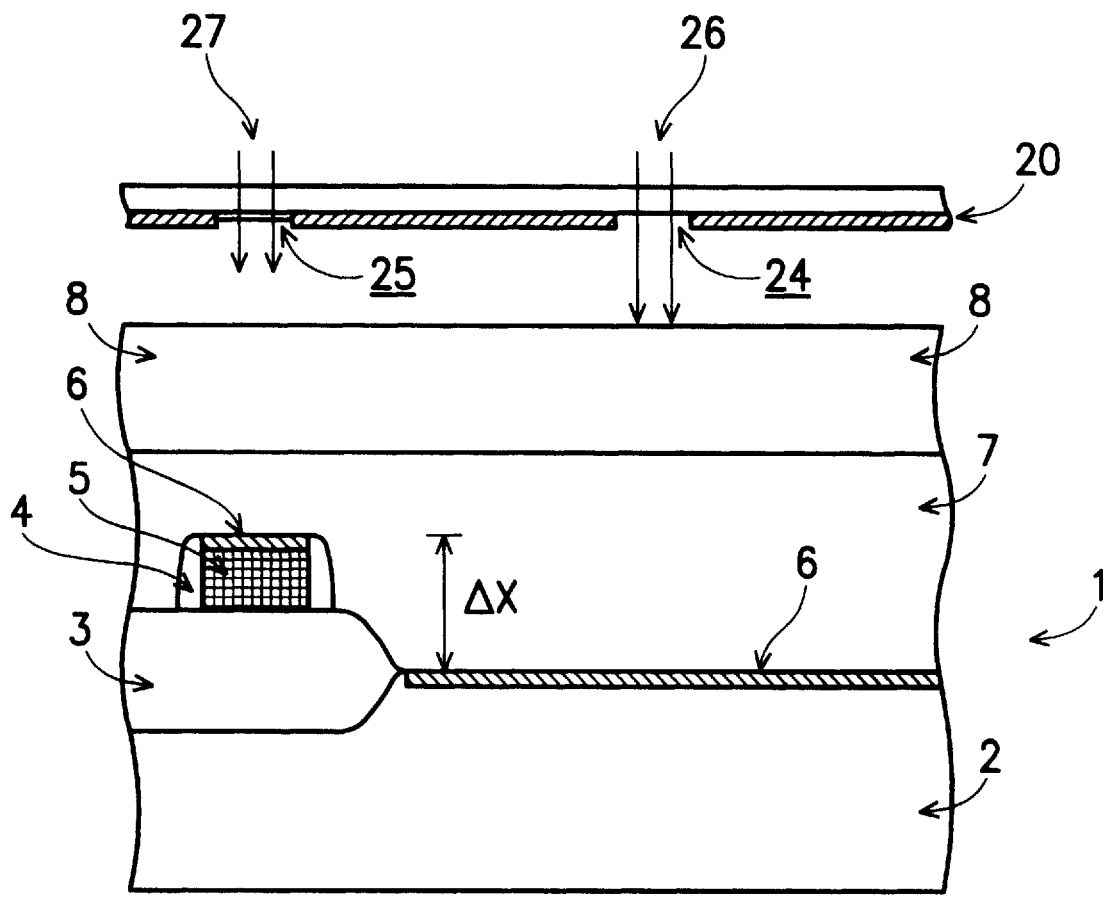
FIGS. 4A through 4C illustrate, in cross section, a contact etching process by using the mask according to the invention.
Figure 4B:
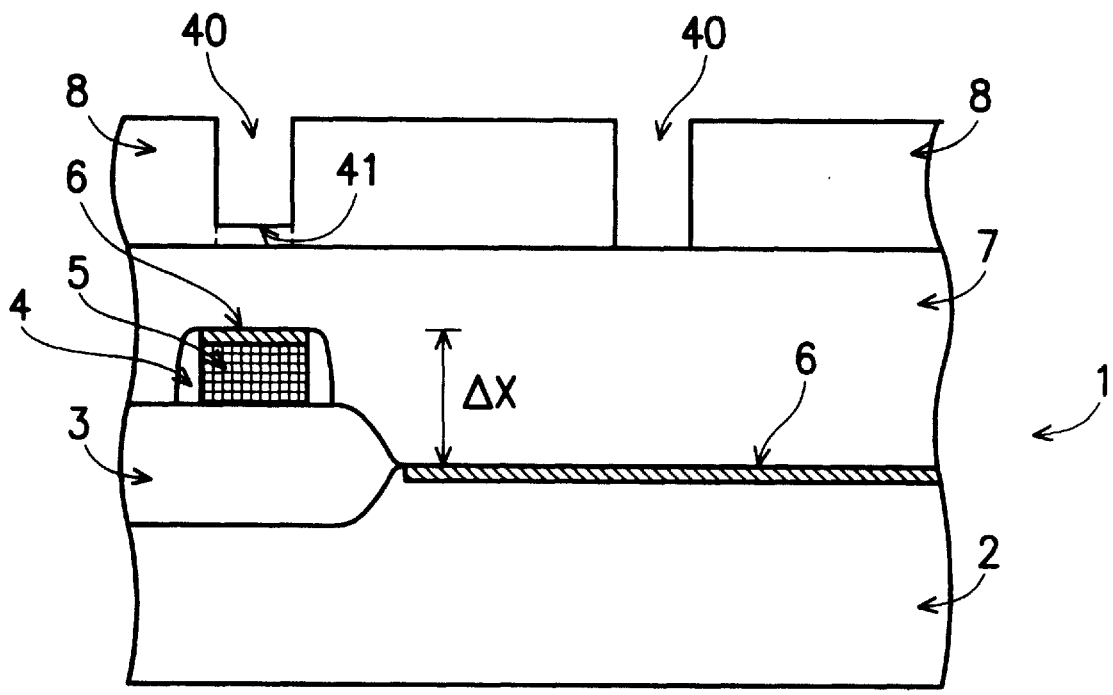
Figure 4C:
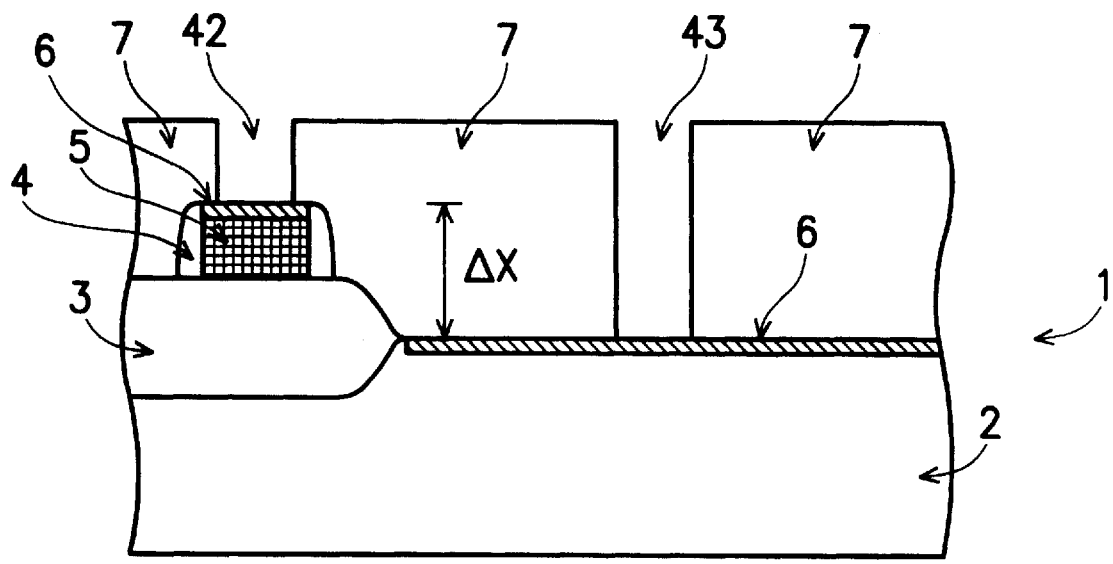

FIG. 4A through 4C illustrate the contact etching process by using the mask according to the invention. Referring to FIG. 4A, a layer of photoresist 8 is coated over a wafer 1 after CMP, and a mask 20 is used to define etching windows on photoresist 8, wherein numeral 26 shows the full light transmission through the first contact pattern region 24 on the mask, and numeral 27 shows the partial light transmission through the second contact pattern region 25 on mask 20. FIG. 4B illustrates the photoresist profile after development, wherein a residual photoresist layer within the etching windows 40 is represented by numeral 41, which acts as a sacrificial layer. FIG. 4C illustrates the contact etching result by using anisotropical etching, wherein numeral 42 shows a shallow contact and numeral 43 shows a deep contact.

The difference of thickness between the thickness of the ILD 7 above the on-field-oxide $TiSi_2$ layer and that above the $TiSi_2$ layer formed on the substrate 2 is represented by $\Delta x$. It is common to etch contacts with depth differences of about 4000~5000 Å in the VLSI process, i.e., $\Delta x$ is about 4000~5000 Å. Although oxide-to-photoresist etching selectivity varies with the photoresist type and etching process condition, typically the selectivity is about 10:1. If $\Delta x$ is about 4000~5000 Å a residual photoresist layer of thickness about 400~500 Å is required to act as a sacrificial layer. In this example, about 80% of light needs to be transmitted through the second (shallow) contact pattern region and 100% of light needs to be transmitted through the first (deep) contact pattern. Consequently, the excess of silicide and polysilicon loss due to the difference of ILD thickness $\Delta x$ is reduced and the contact resistance is not raised unacceptably.

What is claimed is:

1. A mask structure comprising:

a support glass;

a layer of partial light shielding material; formed over said support glass;

a layer of chromium, formed over said layer of partial light shielding material;

said layer of partial light shielding material and said layer of chromium having a first contact pattern formed therethrough; and said layer of chromium having a second contact pattern formed therethrough.

2. A mask structure comprising:

a support glass;

a layer of chromium formed over said support glass;

said layer of chromium having a first contact pattern formed therethrough; and a layer of partial light shielding material formed over a portion of said first contact pattern to define a second contact pattern.

3. The mask structure according to claim 1, wherein said layer of partial light shielding material is a compound which consists of molybdenum and oxygen.

4. The mask structure according to claim 1, wherein said layer of partial light shielding material is a compound, which consists of silicon, nitrogen, and oxygen.

5. The mask structure according to claim 2, wherein said layer of partial light shielding material is a compound, which consists of molybdenum and oxygen.

6. The mask structure according to claim 2, wherein said layer of partial light shielding material is a compound, which consists of silicon, nitrogen, and oxygen.

7. A method for etching a plurality of contacts in a semiconductor wafer comprising the steps of:

forming a layer of photoresist on said semiconductor wafer;

forming a plurality of windows in said layer of photoresist by using a mask, while leaving residual photoresist within portions of said plurality of windows; and forming said plurality of contacts in a semiconductor wafer through said plurality of windows.

8. The method according to claim 7, wherein said mask for forming said contact pattern includes:

a support glass;

a layer of partial light shielding material, formed over said support glass;

a layer of chromium, formed over said layer of partial light shielding material;

said layer of partial light shielding material and said layer of chromium having a first contact pattern formed therethrough; and said layer of chromium having a second contact pattern formed therethrough.

9. The method according to claim 7, wherein a mask for forming said contact pattern comprises:

a support glass;

a layer of chromium, formed over said support glass;

said layer of chromium having a first contact pattern formed therethrough; and a layer of partial light shielding material formed over a portion of said first contact pattern to define a second contact pattern.

10. The method according to claim 7, wherein said plurality of contacts are etched by anisotropical etching.

* * * * *